US006848074B2

(12) United States Patent
Coombs

(10) Patent No.: US 6,848,074 B2
(45) Date of Patent: Jan. 25, 2005

(54) METHOD AND APPARATUS FOR IMPLEMENTING A SINGLE CYCLE OPERATION IN A DATA PROCESSING SYSTEM

(75) Inventor: Robert Anthony Coombs, Wokingham (GB)

(73) Assignee: ARC International, Elstree (GB)

( * ) Notice: Subject to any disclaimer, the term of this patent is extended or adjusted under 35 U.S.C. 154(b) by 482 days.

(21) Appl. No.: 09/886,300

(22) Filed: Jun. 21, 2001

(65) Prior Publication Data

US 2003/0028844 A1 Feb. 6, 2003

(51) Int. Cl.⁷ .............................................. H03M 13/41
(52) U.S. Cl. ...................................... 714/795; 708/207
(58) Field of Search .......................... 714/795; 708/207

(56) References Cited

U.S. PATENT DOCUMENTS

| | | | |
|---|---|---|---|
| 4,979,175 A | 12/1990 | Porter | 371/43 |
| 5,068,859 A | 11/1991 | Collins et al. | 371/43 |
| 5,197,130 A * | 3/1993 | Chen et al. | 712/3 |
| 5,220,570 A * | 6/1993 | Lou et al. | 714/791 |
| 5,309,494 A | 5/1994 | Grehl | 377/39 |
| 5,327,440 A | 7/1994 | Fredrickson et al. | 371/43 |
| 5,331,664 A * | 7/1994 | Desperben et al. | 375/341 |
| 5,408,502 A | 4/1995 | How | 375/340 |
| 5,412,669 A * | 5/1995 | Foland, Jr. | 714/796 |
| 5,430,744 A | 7/1995 | Fettweis et al. | 371/43 |
| 5,469,452 A | 11/1995 | Zehavi | 371/43 |
| 5,537,424 A | 7/1996 | Karabed et al. | 371/43 |
| 5,633,897 A | 5/1997 | Fettweis et al. | 375/341 |
| 5,710,784 A | 1/1998 | Kindred et al. | 371/43 |

(List continued on next page.)

FOREIGN PATENT DOCUMENTS

| | | |
|---|---|---|
| EP | 1 111 801 A1 | 6/2001 |
| EP | 1 120 916 A1 | 8/2001 |
| WO | WO 01/67619 A1 | 9/2001 |

OTHER PUBLICATIONS

Ovadia, et al., "PalmDSPCore™—Dual MAC and Parallel Modular Architecture," (Date Unknown), consisting of 8 pages.

Hardin, et al., "Accelerating Viterbi Decoer Simulations," (Jan., 1999), CommsDesign, consisting of 9 pages.

Shah, et al., "Viterbi Project Final Report," (Spring, 1999), consisting of 15 pages.

*Primary Examiner*—Stephen M. Baker
(74) *Attorney, Agent, or Firm*—Gazdzinski & Associates

(57) ABSTRACT

An improved method and apparatus for performing single-cycle operations (such as Viterbi decode) in digital processors is disclosed. In one aspect, the invention comprises methods for storing ("packing") old and new metric data in memory that cooperate with a single-operand instruction adapted to perform single cycle calculations such as the Viterbi butterfly. Accordingly, such calculations can be computed effectively in software in a single cycle. In another aspect, an improved memory addressing mode is used to write back two new output results at the completion of instruction execution. The improved packing of state metrics in memory, single-operand instruction, and addressing mode can advantageously be integrated into any processor (e.g., DSP, RISC-DSP, or configurable processor) with appropriate memory. The user of such a processor may accordingly write software using the single-operand instruction to perform Viterbi decode with the efficiency comparable to a dedicated hardware implementation.

40 Claims, 10 Drawing Sheets

U.S. PATENT DOCUMENTS

| | | | |
|---|---|---|---|
| 5,715,470 A * | 2/1998 | Asano et al. | 375/341 |
| 5,742,621 A | 4/1998 | Amon et al. | 371/43 |
| 5,748,515 A | 5/1998 | Glass et al. | 364/736.5 |
| 5,752,001 A * | 5/1998 | Dulong | 703/2 |
| 5,778,241 A * | 7/1998 | Bindloss et al. | 712/20 |
| 5,781,569 A | 7/1998 | Fossorier et al. | 371/43.7 |
| 5,784,602 A | 7/1998 | Glass et al. | 395/561 |
| 5,794,062 A * | 8/1998 | Baxter | 712/30 |
| 5,796,757 A | 8/1998 | Czaja | 371/46 |
| 5,815,515 A | 9/1998 | Dabiri | 371/43.7 |
| 5,867,408 A * | 2/1999 | Chauvel et al. | 708/207 |
| 5,881,257 A | 3/1999 | Glass et al. | 395/376 |
| 5,881,259 A | 3/1999 | Glass et al. | 395/386 |
| 5,881,263 A | 3/1999 | York et al. | 395/393 |
| 5,896,521 A * | 4/1999 | Shackleford et al. | 703/21 |
| 5,912,908 A | 6/1999 | Cesari et al. | 371/43.7 |
| 5,987,490 A | 11/1999 | Alidina et al. | 705/523 |
| 5,987,638 A | 11/1999 | Yu et al. | 714/795 |
| 5,991,785 A * | 11/1999 | Alidina et al. | 708/207 |
| 6,002,881 A | 12/1999 | York et al. | 395/800.34 |
| 6,009,128 A | 12/1999 | Mobin et al. | 375/341 |
| 6,029,267 A | 2/2000 | Simanapalli et al. | 714/795 |
| 6,070,263 A | 5/2000 | Tsui et al. | 714/795 |
| 6,115,436 A | 9/2000 | Ramesh et al. | 375/341 |
| 6,125,153 A * | 9/2000 | Sugisawa et al. | 375/341 |
| 6,148,431 A | 11/2000 | Lee et al. | 714/794 |
| 6,163,581 A | 12/2000 | Kang | 375/341 |
| 6,259,749 B1 | 7/2001 | Andoh | 375/341 |
| 6,272,188 B1 | 8/2001 | Mobin et al. | 375/341 |
| 6,289,487 B1 | 9/2001 | Hessel et al. | 714/795 |
| 6,313,963 B1 | 11/2001 | Hsieh | 360/46 |
| 6,317,472 B1 | 11/2001 | Choi et al. | 375/341 |
| 6,330,684 B1 * | 12/2001 | Yamanaka et al. | 714/1 |
| 6,385,757 B1 * | 5/2002 | Gupta et al. | 716/1 |
| 6,397,240 B1 * | 5/2002 | Fernando et al. | 708/603 |
| 6,401,190 B1 * | 6/2002 | Nishioka et al. | 712/24 |
| 6,425,116 B1 * | 7/2002 | Duboc et al. | 716/18 |
| 6,442,672 B1 * | 8/2002 | Ganapathy | 712/201 |
| 6,446,193 B1 * | 9/2002 | Alidina et al. | 712/35 |
| 6,457,173 B1 * | 9/2002 | Gupta et al. | 717/149 |
| 6,477,683 B1 * | 11/2002 | Killian et al. | 716/1 |
| 6,477,697 B1 * | 11/2002 | Killian et al. | 716/18 |
| 6,594,752 B1 * | 7/2003 | Baxter | 712/43 |
| 6,701,515 B1 * | 3/2004 | Wilson et al. | 717/117 |
| 2001/0001616 A1 | 5/2001 | Rakib et al. | 375/259 |
| 2001/0004391 A1 | 6/2001 | Naitou | 375/341 |
| 2001/0007142 A1 | 7/2001 | Hocevar et al. | 714/795 |
| 2001/0021153 A1 | 9/2001 | Taguchi et al. | 369/59.22 |
| 2001/0024474 A1 | 9/2001 | Rakib et al. | 375/259 |
| 2001/0033611 A1 | 10/2001 | Grimwood et al. | 375/219 |
| 2001/0033626 A1 | 10/2001 | Symes et al. | 375/341 |
| 2001/0037486 A1 | 11/2001 | Traeber | 714/795 |
| 2001/0040916 A1 | 11/2001 | Sato | 375/150 |

* cited by examiner

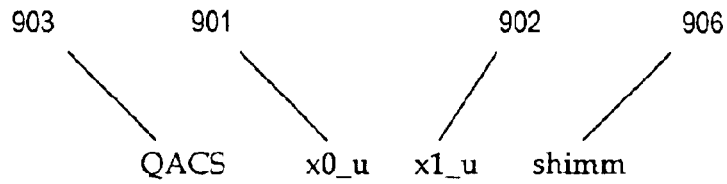

Fig. 10

| Bit 0. +/-. | If '1' ALU0 is in ADD mode, otherwise subtract. |
| Bit 1. LD0/LD2. | If '1' ALU0 takes its operand source as LD0 otherwise LD2. |
| Bit 2. +/-. | If '1' ALU1 is in ADD mode, otherwise subtract. |
| Bit 3. LD1/LD3. | If '1' ALU1 takes its operand source as LD1 otherwise LD3. |
| Bit 4 +/-. | If '1' ALU2 is in ADD mode, otherwise subtract. |
| Bit 5. LD0/LD2. | If '1' ALU2 takes its operand source as LD0 otherwise LD2. |
| Bit 6. +/-. | If '1' ALU3 is in ADD mode, otherwise subtract. |
| Bit 7. LD1/LD3. | If '1' ALU3 takes its operand source as LD1 otherwise LD3 |

Fig. 11

METHOD AND APPARATUS FOR IMPLEMENTING A SINGLE CYCLE OPERATION IN A DATA PROCESSING SYSTEM

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates generally to data processing, and more particularly to the processing of algorithms in software that benefit from efficient implementation of add-compare-select (ACS) butterfly operations.

2. Description of Related Technology

The computational burden of several important signal processing algorithms can be reduced by taking advantage of symmetry. One notable use of such symmetry in a signal processing application is the processing of "butterflies" in the Viterbi Algorithm (VA) used for the decoding of convolutionally encoded data. The Viterbi decoding algorithm is widely used in the area of data communications, such as for example in cellular telephones and modulator-demodulator devices ("modems"), where data must be recovered from a noisy channel. Convolutional decoding using algorithms such as the Viterbi Algorithms are normally performed on the aforementioned "butterfly" arrangement of old and new metric values. These algorithms are used to decode and estimate the most probable information sequence transmitted over a communications channel that has added noise to the signal. Because this decoding process is computationally intensive (and thereby consumes processor resources resulting in increased power consumption and heat generation), considerable effort has historically been expended on trying to make the necessary calculations as efficient as possible. For example, the hardware units described in U.S. Pat. No. 5,987,638 entitled "Apparatus and method for computing the result of a viterbi equation in a single cycle" and assigned to LSI Logic Corporation, ('638 patent) or the state metric memory arrangement disclosed in U.S. Pat. No. 4,979,175 entitled "State metric memory arrangement for a viterbi decoder" and assigned to Motorola Corp. ('175 patent), or the shift-left instruction disclosed in U.S. Pat. No. 5,742,621 entitled "Method for implementing an add-compare-select butterfly operation in a data processing system and instruction therefor" also assigned to Motorola Corp. ('621 patent), are generally intended to address such computational efficiency considerations.

Within certain signal processing algorithms such as the aforementioned Viterbi decoding algorithm, most processing cycles are used in the metric update routine. In most systems using convolutional encoding, the number of bits used to represent every input bit (known generally as the "rate") and the encoding polynomials are carefully chosen to produce a symmetrical relationship between previous delay states, current delay states, and the path states between them. In the usual encoding case, two previous delay states, two current delay states, and the four possible paths between them can be drawn as a "butterfly" in a trellis diagram (see FIG. 1). In the decode process, butterflies can also be used to reduce the amount of data movement and calculation. The VA encode/decode can be accomplished using a general purpose processor (e.g., CISC) in software. Such software approach has the advantage of flexibility; specifically, it is possible to readily change the encode/decode operations by altering the software program. Such flexibility, however, comes at the cost of efficiency, since it takes many more cycles to implement the software approach than would be needed for a comparable hardware solution. Decoding in software also has the advantages afforded by the sophisticated compiler and debug tools currently available to the programmer.

Prior art Viterbi hardware-based accelerators such as that set forth in the '638 patent can perform a single cycle butterfly calculation, but suffer from the disadvantage that they do not provide a flexible solution that can be readily modified by software. Additionally, separate co-processor blocks utilized with such designs are inefficient in terms of silicon usage, as the logic employed within the co-processor is not usually re-used or adaptable for other functions. For example, the memory space of such a hardware solution used to store the old and new state metric values will be dedicated memory for the co-processor, thereby making such solutions non-optimized with respect to silicon usage.

In terms of software solutions, typical prior art processors with specialized metric update instructions in their instruction set architectures (ISAS) take more than one cycle for the update due to (i) the use of several memory pointers (typically three), and (ii) the need to read two variables from memory and write two variables to memory. Classic instruction set architectures work on one or two input operands and produce one result as output, and accordingly are not suited to a single instruction that can perform a complete butterfly calculation. In a typical prior art implementation 200 of storing the old and new metric data (FIG. 2), three data buffers are used: (i) the "old" metric buffer 202; (ii) the lower half "new" metric buffer 203; and (iii) the upper half new metric buffer 204. Each of these three buffers has a separate pointer associated therewith. FIG. 3 illustrates a typical prior art multi-cycle (e.g., four-cycle) butterfly metric update using three pointers, based on the buffer arrangement of FIG. 2. Prior to the butterfly calculation, local distances (LDs) are calculated per step 300; these LDs are loaded into registers associated with the Viterbi acceleration instructions. In the first cycle 302 of the update operation, two old metric values are read from the applicable buffer, and a pair of paths (i.e., Old_met $(2*j)$+LD, and Old_met $(2*j+1)$−LD) calculated. In the second cycle 304, the maximum of the two paths is identified and stored back in the lower new metric buffer, and a bit shifted into a path transition register. Pointer "B" is also post-incremented. In the third cycle 306 of FIG. 3, the remaining two paths (i.e., Old_met $(2*j)$−LD, and Old_met $(2*j+1)$+LD) are calculated using the values read in the first cycle 302. Pointer "A" is post-incremented. In the fourth cycle 308, the maximum of the two values calculated in the third cycle 306 is stored back to the upper new metric buffer, and another bit is shifted into the path transition register. Pointer "C" is post-incremented.

Based on the foregoing, there is a need to provide an improved configuration adapted to reduce the computation time (and particularly, the number of cycles used) for executing the VA decode in software. Such reduced computation time would provide decode efficiency comparable to hardware implementations, yet with the attendant benefits of flexibility and the availability of compiler and debug tools associated with software solutions. This improved configuration would also be readily implemented in existing processor instruction set architectures (ISAs) so as to minimize the changes necessary thereto. Furthermore, this improved configuration would ideally be adapted to utilize silicon-efficient hardware (including memory), thereby keeping the size of the processor to a minimum.

SUMMARY OF THE INVENTION

In a first aspect of the invention, an improved processor is provided which is adapted to perform single cycle processing of path metrics arranged in a "butterfly", which is critical to the efficient decoding of convolutionally encoded data using for example the Viterbi Algorithm (VA). In one exemplary embodiment, the processor comprises an extensible reduced instruction set (RISC) processor core that incorporates an extension arithmetic logic unit (ALU) and memory (e.g., XY memory). The custom extension ALU comprises logic which is used in conjunction with an addressing mode adapted for writing back the new metric data into XY memory, thereby enabling single cycle "butterfly" processing of path metrics or other comparable data. The processor's Instruction Set Architecture (ISA) is advantageously configured so that the VA decode can be readily performed in software by a programmer or design engineer.

In a second aspect of the invention, an improved method of producing a processor adapted for performing convolutional decoding is disclosed. In one exemplary embodiment, the method comprises writing an extension instruction (e.g., add-compare-select (ACS) instruction) in a hardware description language (HDL); adding the extension instruction to the design of extended data processor; synthesizing the extended processor design, including extension ALU and associated logic; generating a software function incorporating the aforementioned instruction; and using the instruction to control the operation of the extension ALU and hardware during operation of the processor.

In a third aspect of the invention, an improved extension arithmetic logic unit (ALU) is disclosed. The improved ALU requires only one operand from the storage device (e.g. XY memory), and is configured to perform single cycle butterfly processing. The use of a single-operand ACS instruction advantageously allows other bits encoded in the instruction format to control the operation of the extension ALU. In one exemplary embodiment, the extension ALU comprises a plurality of parallel multiplexers having the Viterbi local distance (LD) values as inputs. The local distance values are held in extension registers and are written to prior to using a quad add-compare-select (QACS) instruction. The outputs of these multiplexers and data from the XY memory provides the input to four parallel arithmetic units (AUs). The outputs of two AUs are compared using two comparators to determine (i) which AU output is taken as the updated metric, and (ii) whether a logic '1' or '0' test control (TC) bit is shifted into associated registers. The improved ALU of the invention is advantageously controlled by using the short immediate bits available in the instruction set architecture of the aforementioned configurable data processor.

In a fourth aspect of the invention, an improved configuration and method of arranging state metric data in a storage device is disclosed. In one exemplary embodiment, the metric values are packed into an XY memory such that the two returning metric values are at the same address and position in X or Y memory, respectively; e.g. if the low half new metric value is to be written into the bottom 16-bits of X at address 0x12345, then the associated high half new metric value will be written into the bottom 16-bits of Y at address 0x12345. This approach advantageously allows the ACS instruction to use a single pointer for writing the two new metric values back to memory when used in conjunction with a custom addressing mode.

In a fifth aspect of the invention, a custom addressing mode for writing data back to the storage device is provided. In one embodiment, the custom addressing mode is used to write back two new path metric values to the XY memory array; one value to X memory and one value to Y memory. This custom addressing mode allows the two new metric values to be written back to XY memory using only one pointer, an important feature in enabling single cycle operation. This aspect of the invention affords a significant benefit in that the single cycle QACS instruction is compatible with XY memory built from 1-read, 1-write dual port memory rather than more area inefficient storage devices (e.g., triple port RAM's) often associated with processors such as DSPs.

In a sixth aspect of the invention, data bits present in the instruction word are used as control bits to alter the function of the extension ALU implementing the QACS logic. In one exemplary embodiment, the short immediate (shimm) bits are used to control (i) the input source to the ALU, and (ii) the functional state of the add/subtract units (e.g., whether they are adding or subtracting). This approach advantageously allows the QACS instruction great flexibility, so that the programmer can readily change the detailed operation of the QACS functionality by changing the value of the shimm bits of the instruction word.

BRIEF DESCRIPTION OF THE DRAWINGS

FIG. 10 is a graphical representation of an exemplary format of the QACS instruction of the present invention (as applied to Assignee's aforementioned ARC Cores V3 processor single-operand format) with the short immediate bits used as a control field for the extension ALU.

FIG. 11 is a graphical representation of one exemplary coding for the short immediate bits used to control the extension QACS ALU according to the present invention.

DETAILED DESCRIPTION

Reference is now made to the drawings wherein like numerals refer to like parts throughout.

As used herein, the term "processor" is meant to include any integrated circuit or other electronic device capable of performing an operation on at least one instruction word including, without limitation, reduced instruction set core (RISC) processors such as the ARC user-configurable core manufactured by the Assignee hereof, central processing units (CPUs), and digital signal processors (DSPs). The hardware of such devices may be integrated onto a single piece of silicon ("die"), or distributed among two or more die. Furthermore, various functional aspects of the processor may be implemented solely as software or firmware associated with the processor.

Additionally, it will be recognized that the term "stage" as used herein refers to various successive stages within a pipelined processor; i.e., stage 1 refers to the first pipelined stage, stage 2 to the second pipelined stage, and so forth.

Furthermore, the term "storage device" is used to refer to a device adapted to store one or more pieces of data. While the following description is cast primarily in terms of an XY memory of the type well known in the art, it will be recognized that other types of memory and storage devices may be used consistent with the invention. Specifically, any type of storage device having address space that can be functionally partitioned or divided into two or more "component" spaces, whether physically integrated or otherwise, may be substituted.

As used herein, the terms "arithmetic" and "arithmetic unit" refer to operations and devices for performing arithmetic operations including, without limitation, addition, subtraction, multiplication, comparison of two or more values, division, shifting of one or more bits, and the like.

It is also noted that while portions of the following description are cast in terms of VHSIC hardware description language (VHDL), other hardware description languages (HDL) such as Verilog® may be used to describe various embodiments of the invention with equal success. Furthermore, while an exemplary Synopsys® synthesis engine such as the Design Compiler 2000 (DC00) is used to synthesize the various embodiments set forth herein, other synthesis engines such as Buildgates® available from, inter alia, Cadence Design Systems, Inc., may be used. IEEE std. 1076.3-1997, IEEE Standard VHDL Synthesis Packages, describe an industry-accepted language for specifying a Hardware Description Language-based design and the synthesis capabilities that may be expected to be available to one of ordinary skill in the art.

Figure 1:
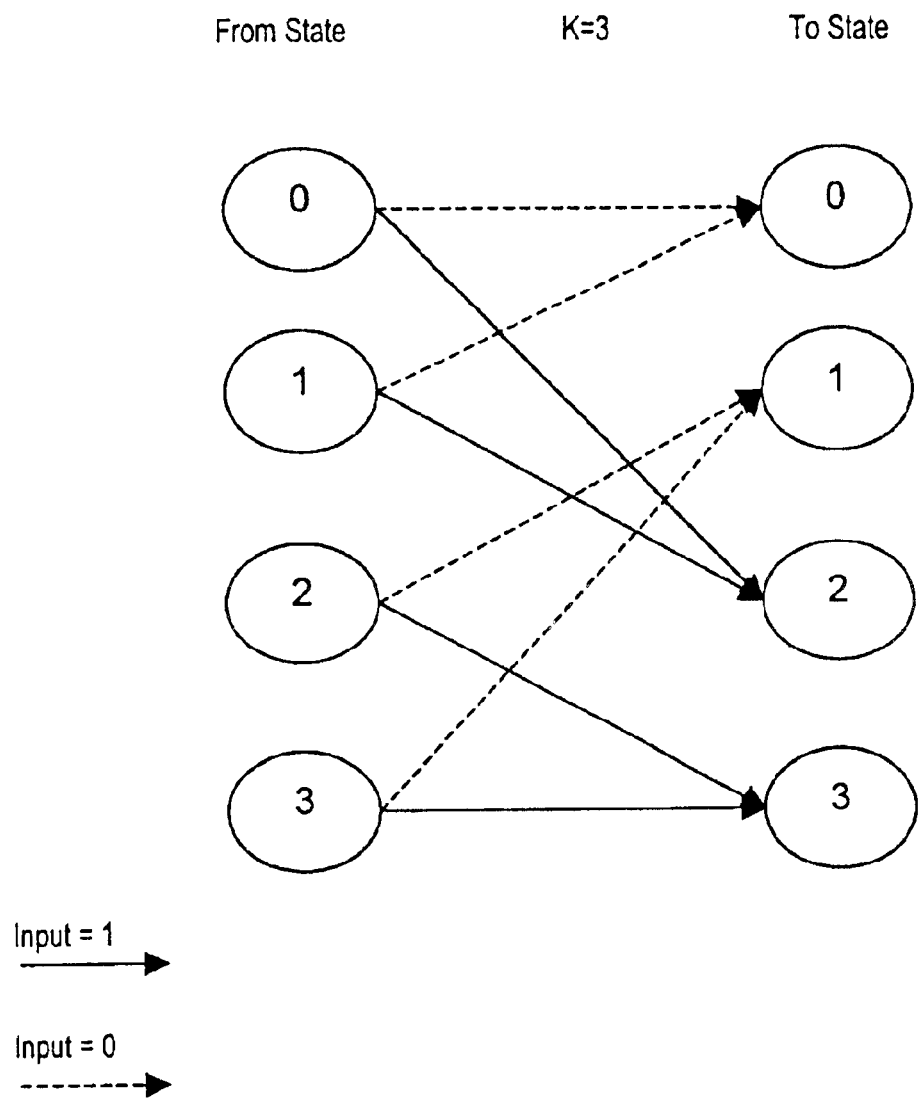
FIG. 1 is a logical state diagram illustrating prior art butterfly structure(s) for constraint length equal to 3, rate one-half convolutional encoder.
Figure 2:
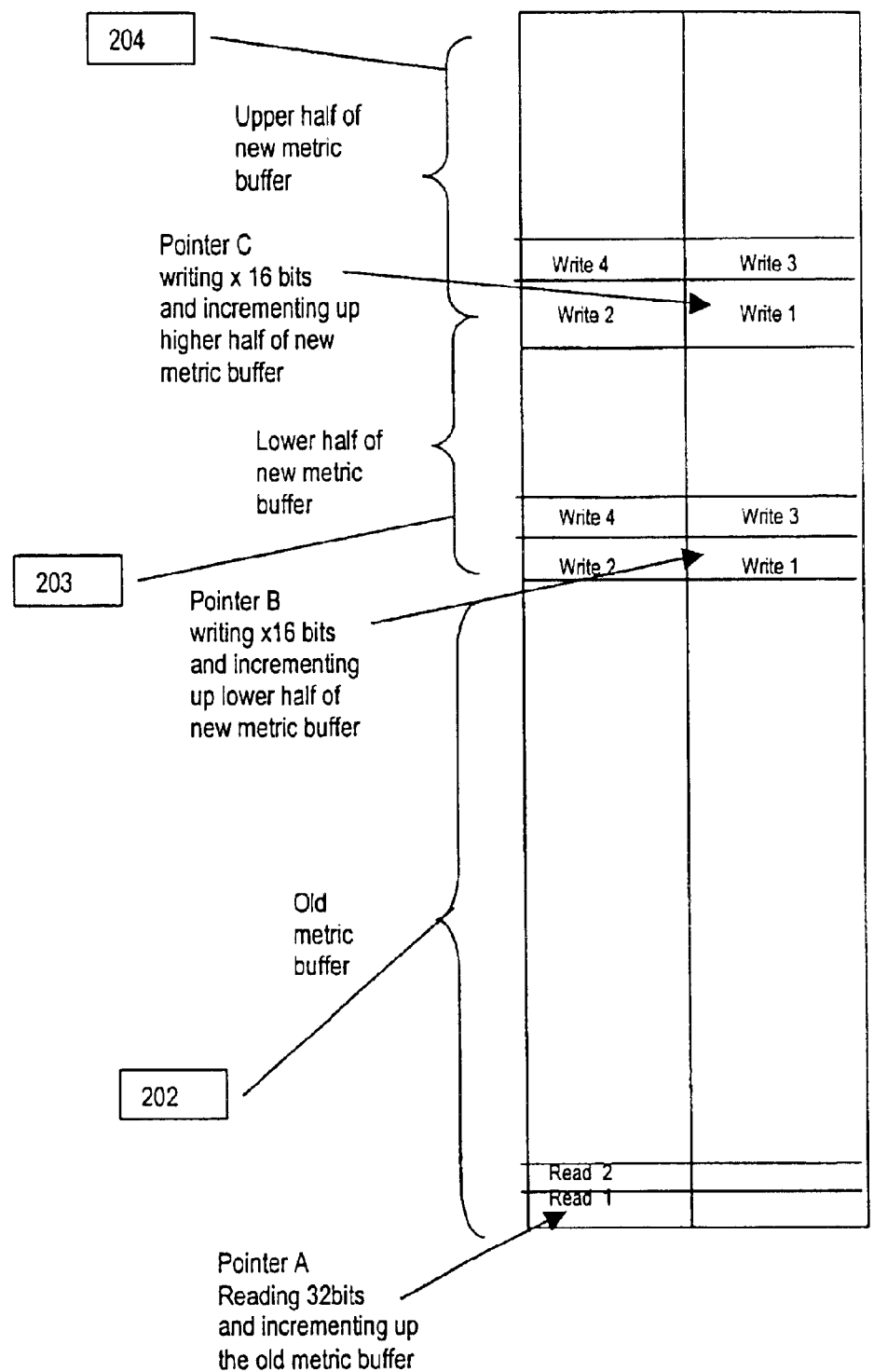
FIG. 2 is a logical block diagram illustrating the storage of "old" and "new" metrics according to a typical prior art architecture.

Referring again to FIG. 1, a Viterbi butterfly logically connects two previous state values, the four possible paths between them, and the two new state values. The butterfly calculation therefore requires the reading of two previous or "old" values, four path calculations, and the writing of two new values back to memory. Additionally, the most probable of the paths need to be stored; i.e., 2-bits for every butterfly, which allows four distinct binary permutations describing respective ones of the four paths. This process is widely known as the metric update stage of the VA, and must be calculated a number of times for every new input symbol. In the case of Third Generation Partnership Project (3GPP) voice applications for example, there are 256 "old" values which require 128 butterfly calculations. Consequently, under the prior art, significant effort has gone into reducing the number of clock or machine cycles required in calculating Viterbi butterflies. Prior art Viterbi butterfly accelerators can generally be divided into two categories: (i) hardware co-processor Viterbi calculators that perform the computation in logic; and (ii) specialized instructions included within the instruction set architecture (ISA) of a programmable processor.

In general terms, the present invention comprises four primary elements: (i) a custom extension ALU; (ii) an addressing mode to a storage device (e.g., XY memory); (iii) an associated method of "packing" path metrics into the storage device; and (iv) the use of data (such as short immediate data) to control the operation of the extension ALU. When the elements listed above are applied to a programmable processor device (such as the ARC™ user-configurable digital processor), accelerated performance including, inter alia, single cycle Viterbi "butterfly" metric update, is realized. As previously described, convolutional decoding using algorithms such as the Viterbi Algorithms are normally performed on the "butterfly" arrangement of old and new metric values. These algorithms are used to decode and estimate the most probable information sequence transmitted over a communications channel that has added noise to the signal. The accelerated performance provided by the present invention enables the device to calculate these path metric probabilities associated with the VA approximately twenty times faster than the same device not so equipped. Accordingly, devices fitted with the present invention can decode data using fewer clock cycles, thereby allowing either (i) higher data rates with a fixed clock frequency; or (ii) lower power consumption via reduction of the clock frequency required to perform the coding operation. This type of improvement can have a profound beneficial impact, such as on the power dissipation of a handset, or on the number of channels an ASIC can handle in the base stations of a mobile communications architecture such as GSM or CDMA. Viterbi decoding consumes a significant percentage of processing power in the base station and handset.

Figure 3:
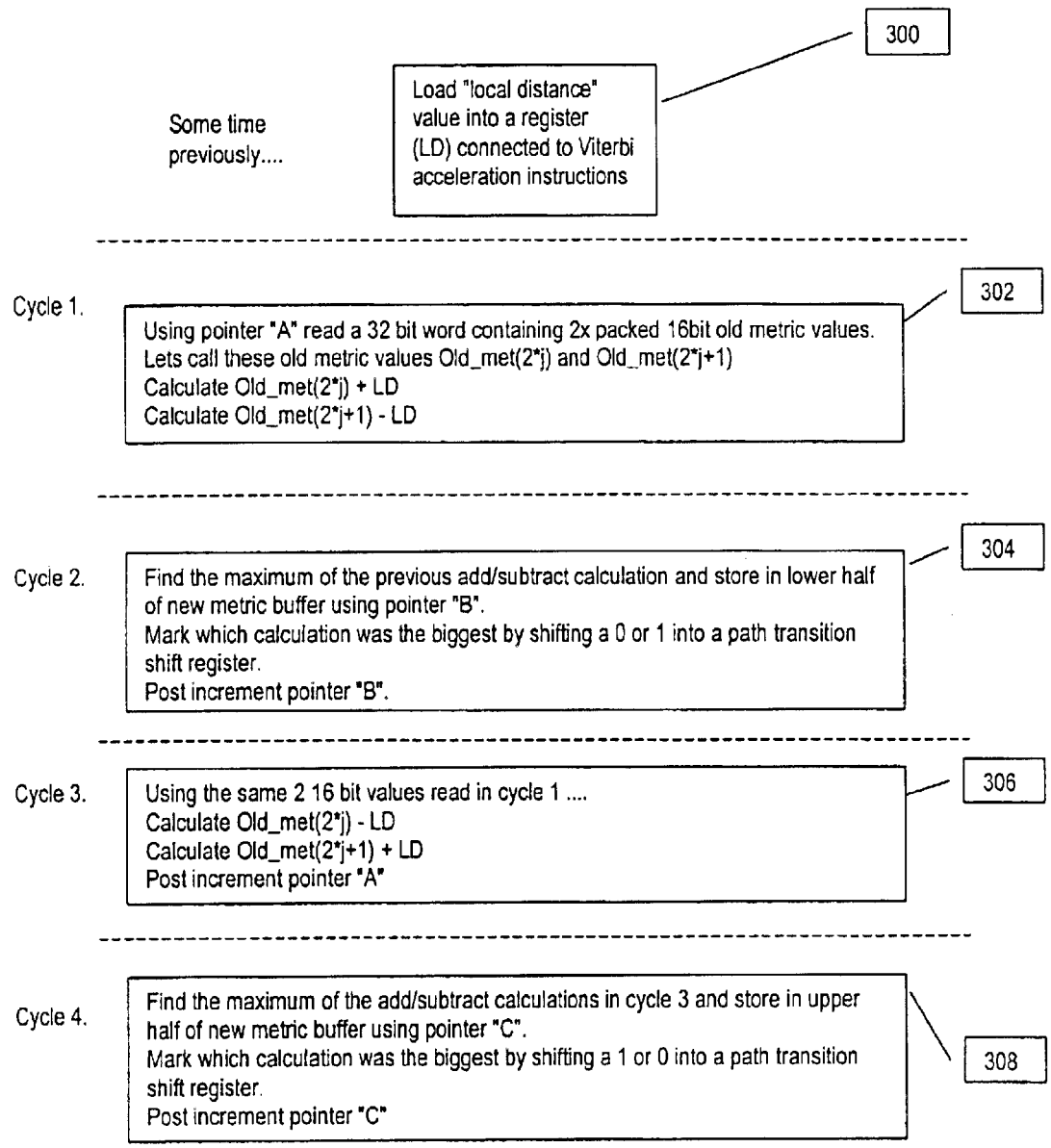
FIG. 3 is a logical flow diagram illustrating the methodology used by a typical prior art DSP architecture processor when decoding convolutionally encoded data using a Viterbi algorithm (VA).

In contrast to the multi-cycle operation of FIG. 3 previously described herein, the present invention combines methods of storing old and new metric values in a processor's storage device (e.g., XY memory), with an extension ALU for calculation of path metrics, and a specialized write back addressing mode, the foregoing which advantageously provides a flexible single cycle butterfly instruction. This instruction may be readily implemented in software by one of ordinary skill to achieve single cycle efficiency without the drawbacks of inflexibility and silicon usage commonly associated with hardware implementations.

In one exemplary implementation of the invention, the method and apparatus are applied a user-configurable extensible data processor, such as the ARC™ processor produced by the Assignee hereof. The architecture of the ARC processor (prior to the implementation of the present invention) is shown as FIG. 4 herein for illustration purposes. It will be recognized, however, that the present invention may be applied with equal success to other processor devices, including for example a fixed architecture digital signal processor (DSP).

The present invention assumes the use of memory 405 (e.g., XY memory) of the type which is commonly used in processors for storing data that needs to be processed efficiently by a software algorithm, and the use of address generation units to perform the address arithmetic. In the case of the ARC processor depicted in FIG. 4, a four-stage pipeline is shown: in stage 1 401, instructions are fetched from the instruction cache 406; in stage 2 402, one or two operands are fetched from XY memory 405 or the core registers 408; in stage 3 403, the instruction is performed in either the base ALU 405 or in one of a number of user-selectable and configurable hardware units 409. In stage 4 404 of the pipeline, the results of the instruction execution are written back to XY memory 405 or the core registers 408.

Figure 4:
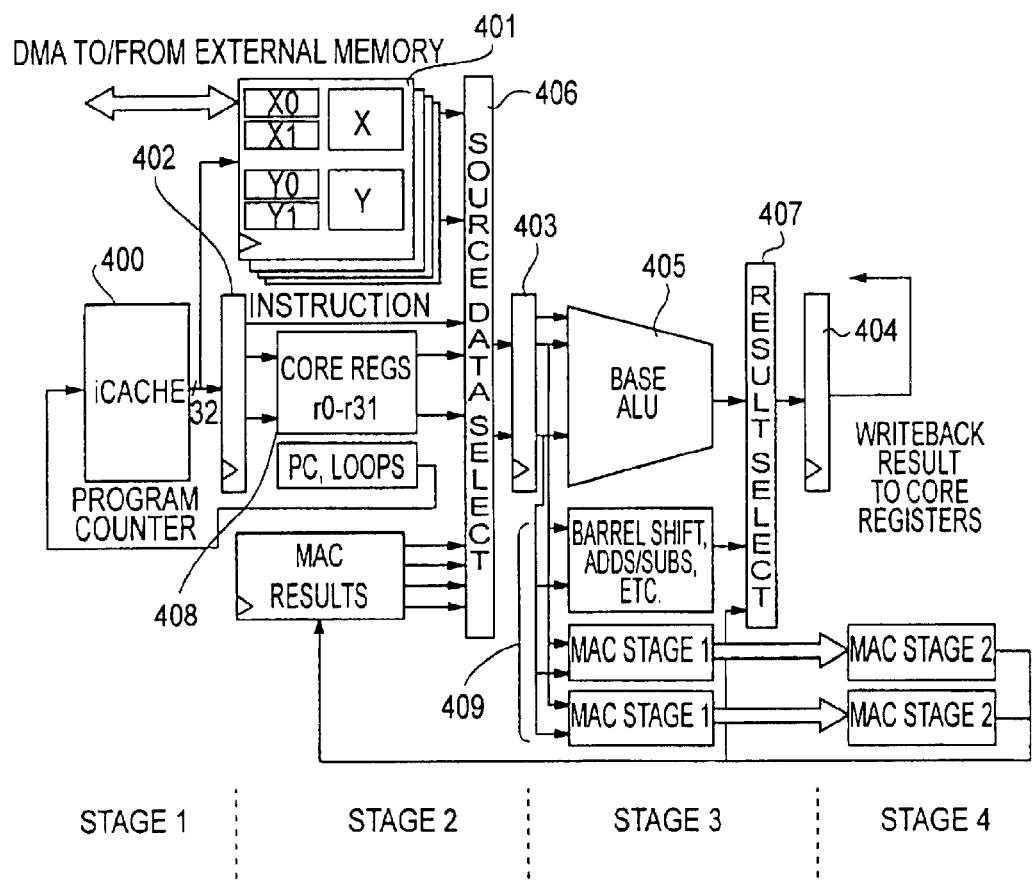
FIG. 4 is functional block diagram illustrating the architecture of an exemplary prior art RISC processor (such as that produced by the Assignee hereof), prior to inclusion of the apparatus of the present invention.
Figure 5:
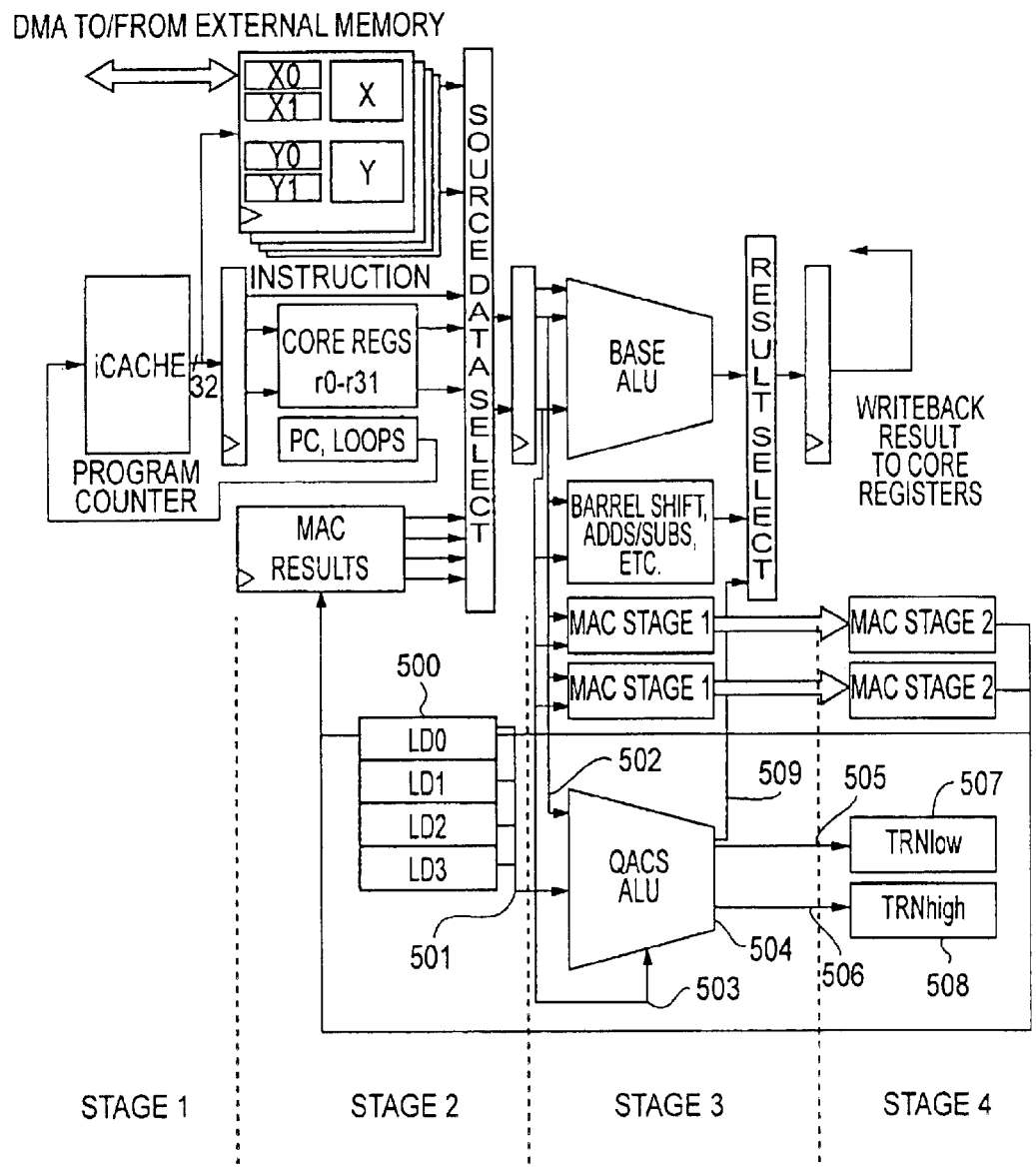
FIG. 5 is functional block diagram illustrating the architecture of the exemplary RISC processor of FIG. 4 modified to include the extension ALU of the present invention.

Referring now to FIG. 5, one exemplary embodiment of the processor of FIG. 4, as modified according to the present invention, is described. In the embodiment of FIG. 5, the ACS extension ALU is added to the ARC RISC-DSP processor in stage 3 of the pipeline. The ACS extension ALU 504 takes as input a first operand 502 and uses the user-definable immediate bits contained in the second operand 503 as the control bits to the extension ALU. Outputs from the ACS extension ALU are the result bus 509, a low path transition bit 505, and a high path transition bit 506. The two path transition bits are input to separate shift register local storage devices 507 and 508 ("TRNlow" and "TRNhigh"). Other inputs to 504 are four pre-calculated local distance (LD) values 500 shown as LD0, LD1, LD2 and LD3, respectively. For the purposes of VA metric update routine, the local distance values will remain constant; however, it will be appreciated that non-constant LD variables may be substituted depending on the application. For example, the LD values could be made to vary as a function of one or more other variables or inputs.

Figure 6:
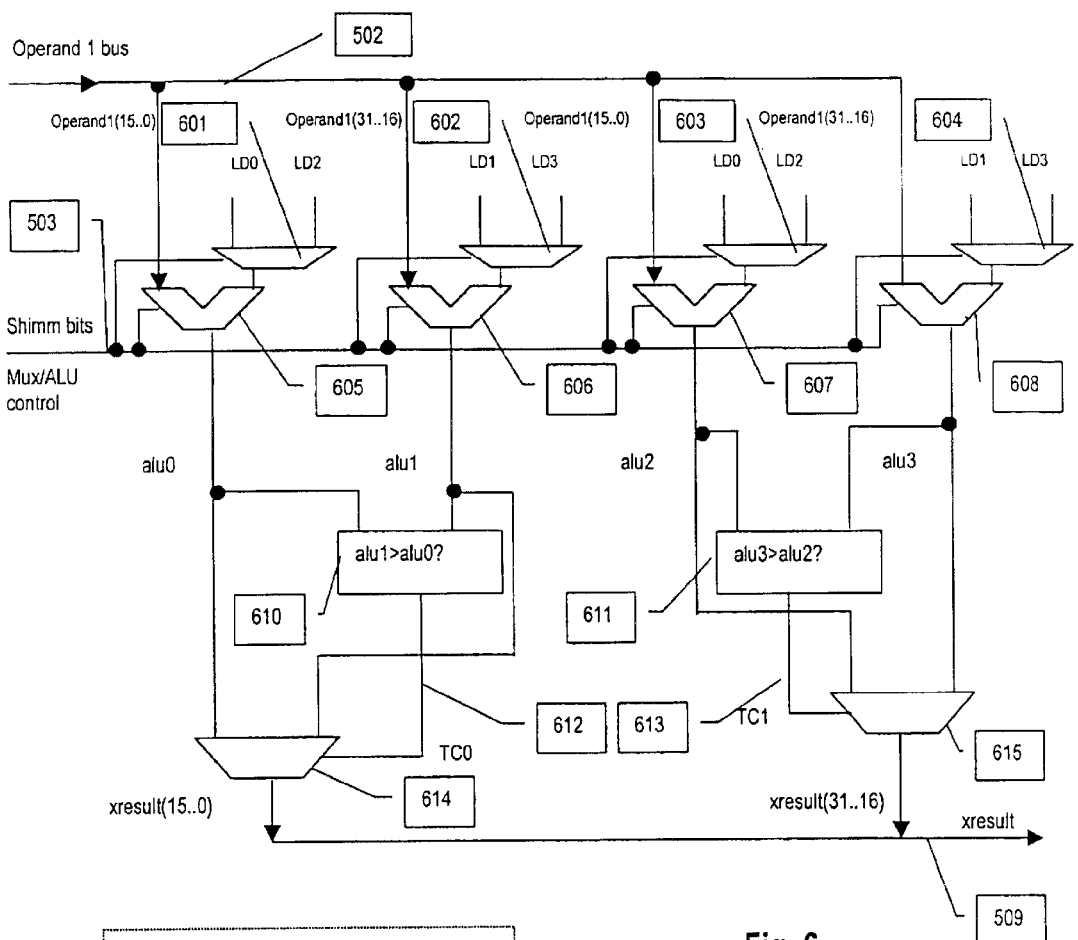
FIG. 6 is a functional block diagram of one exemplary embodiment of the extension ALU used to implement the QACS functionality of the present invention.
Figure 5A:
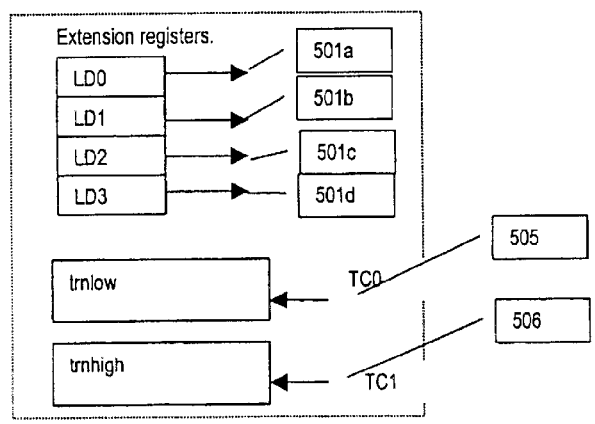
FIG. 5a is a functional block diagram illustrating the arrangement of the extension registers and transition shift register storage devices associated with the extension ALU of the processor of FIG. 5.

One exemplary embodiment of the ACS extension ALU 504 is shown in further detail in FIG. 6. A single operand input bus (corresponding to the first operand 502 previously described) is connected to four add/subtract units 605, 606, 607, 608. The single operand bus of width 2*N-bits includes two old path metrics (each of width N-bits) that have been read from XY memory 405. The other input to each of the add/subtract units 605, 606, 607, 608 comprises the output of one of four multiplexer units 601, 602, 603, 604. This configuration, having four add/subtract units and four multiplexers, is referred to herein as the "quad" ACS or QACS ALU configuration. The multiplexer units each select local distance (LD) values to be used in the calculation. The first and third multiplexer units 601, 603 multiplex between LD0 and LD2 values, whereas the second and fourth multiplexers 602, 604 multiplex between LD1 and LD3 values. The local distance values are calculated prior to execution of the ACS instruction, and their values held in memory such as the local registers 501a, 501b, 501c and 501d of FIG. 5a. These local distance values are then connected to the ALU as busses containing constant local values.

In the illustrated embodiment, both the add/subtract units 605–608 and the local distance multiplexer units 601–604 are controlled by the user-defined short immediate bits contained in the ACS instruction, although other control schemes may be employed. For each ACS instruction used in the software program, a user-defined bit field such as short immediate (shimm) bits are used to provide detailed control of the extension ALU 504. In the case of the aforementioned ARC processor, these user-defined bits are presented to the extension ALU as the second operand 503. This is in contrast to the prior art, wherein the shimm bits represent a data input. Rather, in the case of the present invention, the shimm bits are used as control bits that are decoded to modify the behavior and operation of the extension ALU 504 as desired by the programmer. Outputs from the first and add/subtract units 605, 606 are fed into compare and select units 610, 614 of the type well known in the art to form the upper half of the result (xresult) 509. Outputs from third and fourth add/subtract units 607, 608 are fed into corresponding compare and select units 611, 615 to form the lower half of the result 509. The output ("TC0") 612 of the first compare unit 610 is stored in the transition shift register "TRNlow" 505 (FIG. 5a) during execution of the extension instruction. Similarly the single bit output ("TC1") of the second compare unit 611 is stored in the transition shift register "TRNhigh" 506. An exemplary pseudo "C" representation of the QACS instruction referenced herein is presented in Appendix I hereto, although it will be recognized that other configurations of the instruction may be used.

The ACS extension ALU takes in a single operand 502 and produces a single result ("xresult"); it therefore belongs generally to the class of instruction known as a "single input operand". The use of such single-operand instruction has the benefit of making more bits in the instruction available for use as shimm bits, the latter being required for ALU control as previously described. A second benefit is that only two address pointers, one for the input operand and one for the output, are required; this is in contrast to the three (or more) pointers required by the prior art as previously discussed. Within the first operand 502, the extension ALU 504 assumes that two old metric data have been packed and similarly, within xresult, two new metric values are packed. Consequently the method of the present invention utilizes state metric data that is arranged in a specific way in memory; a special writeback addressing mode to XY is also used for storing the new values contained in xresult 509 in XY memory.

Figure 7:
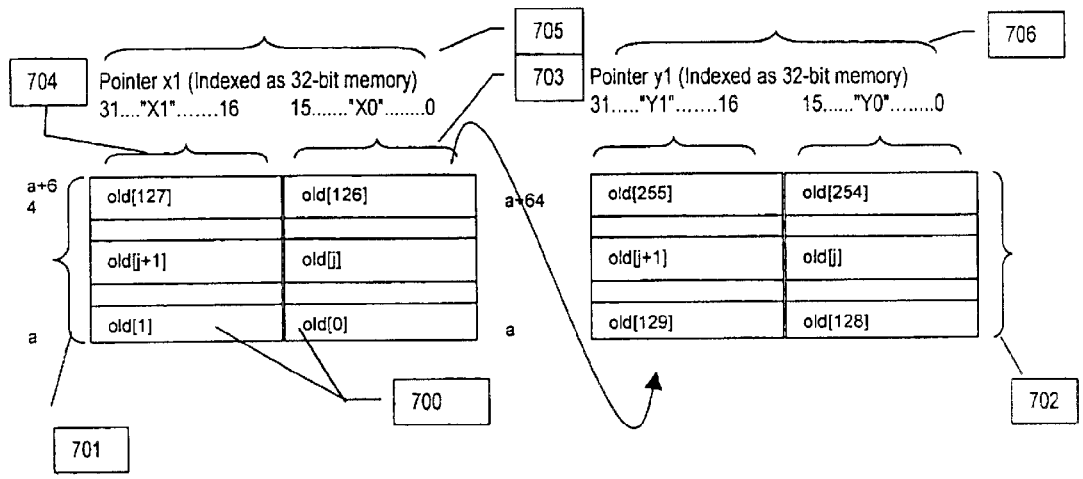
FIG. 7 is an exemplary memory map of "old" metric values stored in XY memory according to the invention, illustrating how such old metric data is read.
Figure 8:
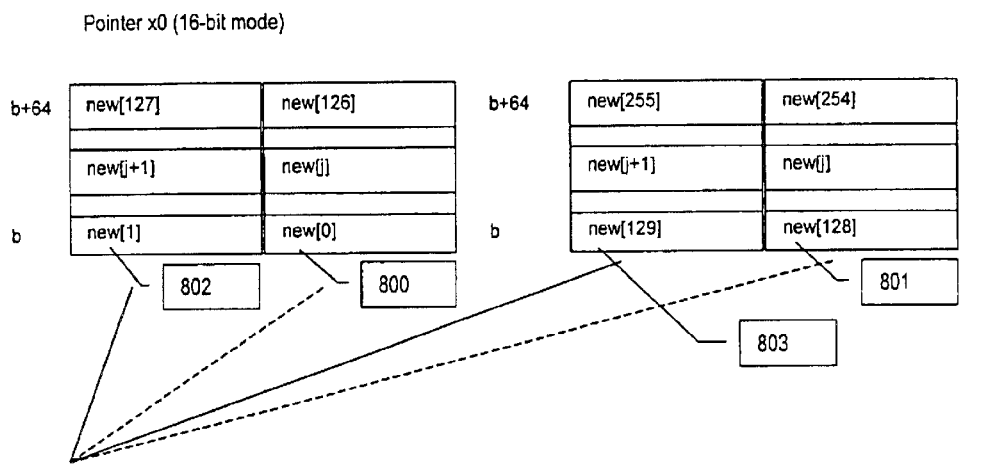
FIG. 8 is an exemplary memory map of "new" metric values stored in XY memory according to the invention, illustrating how such new metric data is written with a new addressing mode.

An exemplary method of storing old metric values in XY memory compatible with the foregoing single-operand instruction is graphically illustrated in FIG. 7. The old metric buffer is split in half, with the lower half metrics 705 stored in X memory and the upper half metrics stored in Y memory 706. It will be recognized, however, that an alternative arrangement having the upper half metrics stored in X memory and the lower half stored in Y memory would be equally successful. The X and Y memories are 2×N-bits wide (e.g. N is 16-bits, and the X and Y memories are 32-bits wide) and two metric values of width N-bits are packed into each 2×N-bit wide X or Y location. One benefit of this arrangement is that a single pointer "x1" can then be used to read two packed metric values; e.g. old[0] and old[1] 700 as an input to the QACS instruction, and then auto-increment at the end of the instruction to point to the next inputs; e.g. old[2] and old[3]. A single input pointer is required for the instruction to be of single input operand type. When the lower half metric values have been read, the same scheme is used on the Y memory using a standard self-incrementing address pointer; e.g. "y1". If the X and Y memories are 2×N-bits wide, it is assumed that the XY memory of the host processor can be read or written to in N-bit mode; e.g. if the X and Y memories are 32-bits wide, then it is possible to read or write in 16-bit mode. A second benefit of this exemplary arrangement of state metrics is that the position or address of any lower half metric e.g. old[j] in X memory is the same as old[j+$2^{k-2}$] in Y memory (where K is the constraint length of the encoder). This feature of the arrangement allows the writeback to occur with 1 pointer via a special N-bit wide dual writeback mode, as shown in FIG. 8. A 2×N-bit wide xresult from the QACS extension ALU is split into one N-bit wide result written into X, and one N-bit wide result written into Y at the same address, e.g. new[0] 800 and new[128] 801 written at address "b". The single writeback pointer e.g. "x0" then increments in a standard N-bit mode to write back new[1] and new[129] on the next QACS instruction. Consequently a single result from the QACS extension ALU 504 is split into its two new metric values, and the values written back into the same positions as the old metric buffer of FIG. 7 using a single pointer and a special split writeback addressing mode. It can be seen from FIGS. 7 and that the writeback of new metrics puts them in the same relative position as those in the old metric buffer. This is highly beneficial from the standpoint that when all the new metrics have been calculated, and the new metric buffer updated, the new metric buffer becomes the old metric buffer for the next symbol. Because the ordering of old metric buffer and new metric buffer are identical, no reordering of metrics is required. Yet a further benefit of this method is that the use of one read pointer and one write pointer is highly compatible with the use of cost effective and commonly available dual port (1 read port, 1 write port) Random Access Memory to form the XY memory. In the exemplary embodiment, the read pointer and write pointer are physically realized as two address generation units, one for the read and one for the write. Consequently the requirement on the DSP memory subsystem is to be able to have one read and one write access per clock cycle. Memory with one read port and a separate write port is suitable for this purpose, for example, 1Read, 1Write SRAM. Traditionally DSP memory subsystems have used more complex memories such as triple port RAM. The use of triple port RAM is not required for the exemplary implementation of the algorithm and the user of the invention can choose denser, cheaper 1Read, 1Write SRAM.

Figure 9:
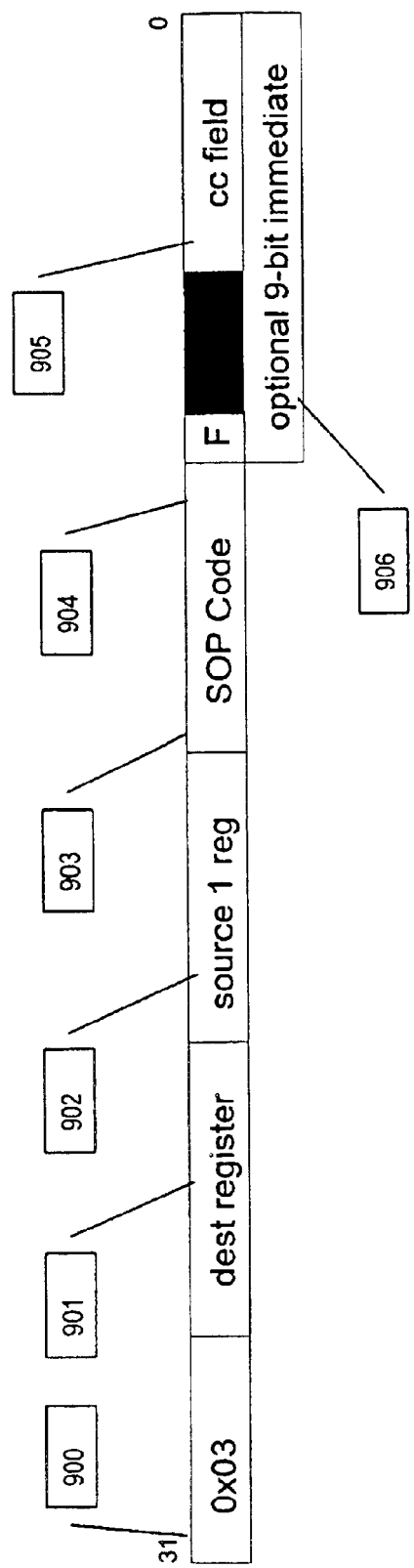
FIG. 9 is a graphical representation of a typical prior art 32-bit instruction set architecture (associated with Assignee's ARC V3 processor) for a single-operand instruction with optional immediate data bits.

FIG. 9 shows one prior art method of encoding a single operand instruction (illustrated in the context of a 32-bit ARC V3 processor manufactured by the Assignee hereof). The first (left-most) field 900 contains a code that tells the processor to decode a single-operand instruction. The second field 901 comprises the destination register. The third field 902 comprises the input operand. The fourth field 903 comprises the single operand (SOP) instruction code. The fifth field 906 is an optional user-defined short immediate (e.g., 9-bit) field, and fields 904 and 905 are optional flag and condition code fields.

In contrast, the exemplary embodiment of the QACS instruction of the invention uses (i) a sliding window register, which is well known to a DSP software artisan of average skill in the art, with the previously described novel N-bit split writeback mode for the destination register 901; and (ii) a second sliding window register with a standard incrementing 2×N-bit read mode, and user defined control bits in the shimm field, although it will appreciated that other approaches may be substituted. Referring now to FIG. 10, one embodiment of the QACS instruction format of the invention is described. As shown in FIG. 10, the instruction mnemonic 903 is given as "QACS"; the destination writeback sliding window register is identified as "x0_u" 901; the input operand sliding window register is identified as "x1_u" 902, and the shimm control bits 906 are appended to the instruction. The "_u" part of the sliding window register identifiers signifies that the address generator units used to calculate the addresses should update (auto-increment) at the end of the instruction, although other means of indicating such auto-increment update may be employed consistent with the invention.

FIG. 11 illustrates one exemplary embodiment of how the user-defined shimm bits are encoded to control the add/subtract units 605, 606, 607, 608 and the local distance (LD) multiplexers 601, 602, 603, 604 of the extension ALU 504. This exemplary encoding of the QACS control bits is used in the software code example of Appendix II hereto. The exemplary embodiment of the extension ALU 504 (FIG. 6) previously described herein requires eight control signals (4 channels×2 signals/channel) which fits within the nine (9) available shimm bits of the ARC instruction set architecture. It will be appreciated, however, that other schemes may be used. For example, instead of using the short immediate (shimm) bits in the QACS instruction to control the extension ALU as previously described, any available user-programmable bits present within the instruction could be used for this purpose. Alternatively, if more or less than eight (8) shimm bits were available in a given processor ISA, a different number of channels (multiplexer/add/subtract units) within the ALU 504 could be used to perform more than one butterfly or less than one butterfly per cycle. In the exemplary implementation one instruction is used on multiple data (two path metrics) and produces two results i.e. QACS is a Single Instruction Multiple Data (SIMD) type instruction fitted into the ISA format of a single operand instruction.

Method of Generating a Processor Design

Figure 12:
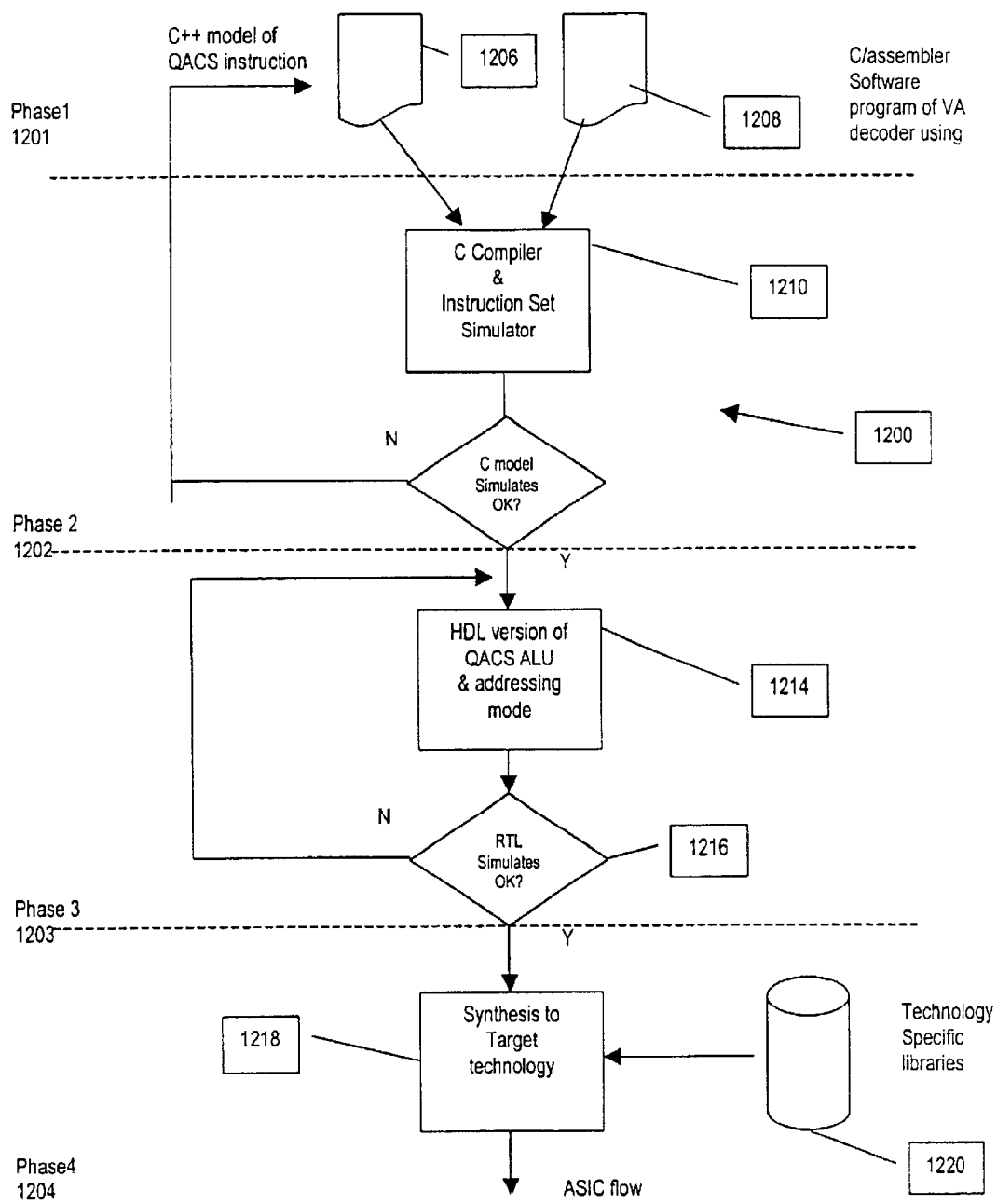
FIG. 12 is a logical flow chart illustrating an exemplary method of generating a processor design adapted for convolutional decoding.

Referring now to FIG. 12, the method of generating an extended digital processor design adapted for, e.g., convolutional decoding as previously discussed herein, is described. It will be recognized that while the following methodology is described in terms of convolutional decoding associated with the well known processing of butterflies in the Viterbi Algorithm, it may be more broadly applied to other types of decoding algorithms and operations.

The method 1200 of the illustrated embodiment is divided into four "phases" 1201, 1202, 1203, 1204 as shown in FIG. 12. The first phase 1201 generally comprises first defining the single operand instruction (e.g., quad add compare select or QACS) in a high level programming language such as "C" or "C++" (step 1206). The 'C++' model of the instruction is compiled as a dynamic link library ( dll) to the instruction set simulator and the compiler is informed of the new instruction e.g. its name and opcode using pragma intrinsics. A computer program utilizing the QACS instruction defined in step 1206 and adapted to perform a desired function such as, inter alia, VA decode, is also written (step 1208) in a high level software language, such as, inter alia, 'C'. The software program having the QACS instruction further uses the method of packing state metrics as previously described herein. Furthermore, the specialized writeback addressing mode and user-defined shimm data are used to control the ALU, and provide an efficient decode routine. Appendix II provides an exemplary assembly code program using the QACS instruction according to the present invention.

Next, in phase 2 1202 of the exemplary method 1200, the program and the "C" (or other programming language) description are compiled (step 1210) and simulated (step 1212) using an instruction set simulator of the type well known in the computer simulation arts.

When a hardware description language (HDL) implementation of the instruction is required, associated extension registers and special addressing mode are defined per step 1214 (phase 3). This HDL is added to a host processor (e.g., DSP or RISC-DSP such as the aforementioned ARC processor produced by the Assignee hereof). The HDL is then co-simulated with the software program of phase 1 to ensure that the HDL has the same functionality as the C (or other language) model per step 1216. If the HDL simulations match the functionality of the C simulations, then stage 4 1204 of the method 1200 is entered, and the user synthesizes a technology-specific netlist per step 1218 using a specific technology library 1220. The result of the synthesis using an HDL compiler according to step 1218 is a netlist that can be further processed by CAD tools to provide the files necessary to configure an integrated circuit such as a Field Programmable Gate Array (FPGA), or the input information to the semiconductor processing flow that results in the manufacture of Application Specific Integrated Circuits (ASICs) as is well known in the semiconductor arts.

Numerous modifications and adaptations of the above described embodiments and aspects of the invention will be readily apparent to a person skilled in the art of designing digital processors (such as digital signal processors and microprocessors) in view of the enclosed disclosure. It will also be recognized that while certain aspects of the invention have been described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

Appendix I

Exemplary Pseudo-Code for VA Extension

The following pseudo code represents the operation of the QACS extension ALU as exemplified in FIG. 6. The input data, operand1, is read from either X or Y memory and contains two packed "old" metrics (X0 and X1) or (Y0 and Y1) respectively. The add/subtract mode of the four ALUs, and the choice of local distance (LD) value, are selected with the short immediate (shimm) bits.

```
{
    alu0 = operand1(15:0) +/- LD0/LD2;
    alu1 = operand1(31:16) +/- LD1/LD3;
    alu2 = operand1 (15:0) +/- LD0/LD2;
    alu3 = operand1 (31:16) +/- LD1/LD3;
    xresult(15:0) = (alu1>alu0) ? alu1 : alu0;
    trnlow = trnlow << 1 | (alu1>alu0);
    xresult(31:16) = (alu3>alu2) ? alu3 : alu2;
    trnhigh = trnhigh << 1 | (alu3>alu2);
}
```

Appendix II

Exemplary Code Example of Metric Update Using QACS.

Listed below is a code example for the metric update of a GSM rate one-half convolutional decoder (Viterbi Algorithm, soft decision) using the QACS instruction of the invention.

```
acs_start:
    ; Get 2 sequential symbols
        mov     r11,    symbol0
        mov     r12,    symbol1
    ; Calculate sum and difference to find local distances.
        add     r14, r11,   r12
        sub     r15, r11,   r12
    ; Store local distances in local distance registers.
        sr      r14,    [AUX_LD0]
        sr      r14,    [AUX_LD1]
        sr      r15,    [AUX_LD2]
        sr      r15,    [AUX_LD3]
    ; Perform the metric update using 8 butterflies
    ; Control the QACS ALU using short immediate data
        QACS    x0_u, x1_u, 0xeb
        QACS    x0_u, x1_u, 0xbe
        QACS    x0_u, x1_u, 0xeb
        QACS    x0_u, x1_u, 0xbe
        QACS    x0_u, y1_u, 0x41
        QACS    x0_u, y1_u, 0x14
        QACS    x0_u, y1_u, 0x41
        QACS    x0_u, y1_u, 0x14
acs_end:
```

I claim:

1. A method for performing an add-compare-select butterfly operation for implementing a Viterbi decoder in a processor having an XY memory and an extension arithmetic logic unit (ALU) associated therewith, comprising:
    disposing old path metrics in said XY memory;
    providing a single-operand add-compare-select (ACS) instruction within the instruction set of said processor, said instruction having at least one short immediate (shimm) data field;
    providing said old path metrics as inputs to said extension ALU;
    controlling at least a portion of the operation of said extension ALU using said at least one shimm field; and
    providing at least one addressing mode for said XY memory that allows new path metrics to be written back to XY memory subsequent to execution of said ACS instruction.

2. A method for performing an operation in a processor having a memory associated therewith, said memory being functionally partitionable into at least two components, said processor having an arithmetic logic unit (ALU) associated therewith, comprising:
    disposing first metrics associated with said operation in said memory;
    providing a single-operand instruction within said processor's instruction set;
    providing said first metrics to said ALU;
    controlling at least a portion of the operation of said ALU using at least one data field of said instruction; and
    providing at least one addressing mode for said memory that allows at least second metrics of said operation to be written back to said memory subsequent to execution of said instruction.

3. The method of claim 2, wherein said act of providing a single-operand instruction comprises:
    defining an add-compare-select (ACS) instruction, said instruction having an instruction format, said format comprising a unique operational code (opcode);
    describing the required functionality of the ACS instruction in a hardware description language (HDL);

simulating the ACS instruction with the host data processor; and synthesizing the HDL to a technology-related netlist.

4. The method of claim 2, further comprising: providing a computer program, at least a portion of said program being rendered in a high-level programming language and incorporating at least one of said single-operand instructions;

determining at least one local distance value;

storing said at least one local distance value in at least one extension register, said at least one extension register being operatively coupled to said arithmetic logic unit (ALU);

initializing a plurality of metric buffers in said memory;

reading old metric values using at least one pointer;

providing metric updates using at least said single-operand instruction; and writing back said metric updates to said memory using said at least one addressing mode.

5. The method of claim 2, wherein said act of disposing comprises:

arranging at least one of said first and second metrics in said memory such that two consecutive old metric values are packed into a single multi-bit value of a first or second component of said memory.

6. The method of claim 5, wherein said act of disposing further comprises arranging at least one of said first and second metrics such that one-half of the at least one first or second metrics are disposed in a first component of said memory, and one-half the at least one first or second metrics are disposed in a second component.

7. The method of claim 6, wherein first and second path metrics are stored in said first memory component at a first address, and $2^{K-2}$ and $2^{K-2}+1$ path metrics are stored in said second memory component also at said first address, wherein "K" comprises the constraint length of the encoding algorithm.

8. The method of claim 2, wherein the act of providing at least one addressing mode comprises describing in HDL said at least one addressing mode, said mode being used in the writeback of new metric data to said memory following execution of said single-operand instruction.

9. The method of claim 8, wherein said single-operand instruction comprises an ACS instruction, and said act of writeback comprises:

writing a first result of said execution of said ACS instruction to a first address within a first component of said memory; and writing a second result of said execution of said ACS instruction to said first address within a second component of said memory.

10. The method of claim 8, wherein said act of providing at least one address mode further comprises:

analyzing said HDL;

simulating said HDL with the host processor and the ACS instruction; and synthesizing said HDL to a technology-related netlist.

11. A data processor, comprising:

a multi-stage instruction pipeline;

an instruction set architecture having a plurality of instructions adapted to run on said processor in said pipeline, at least one of said plurality of instructions comprising a single-operand instruction;

a plurality of extension registers;

an arithmetic logic unit (ALU) operatively coupled to at least a portion of said plurality of extension registers; and wherein said processor further comprises at least one addressing mode adapted for addressing an associated storage device, said at least one mode being further particularly adapted to write back at least one path metric to said storage device subsequent to execution of said single-operand instruction.

12. The processor of claim 11, wherein said ALU is disposed substantially within the third (execution) stage of said pipeline.

13. The processor of claim 11, wherein said single-operand instruction comprises an add-compare-select instruction having a plurality of data fields.

14. The processor of claim 13, where at least one of said plurality of data fields is used to control the operation of said ALU.

15. The processor of claim 14, wherein said ALU comprises at least one multiplexer and at least one add-subtract unit.

16. The processor of claim 15, wherein said at least one multiplexer and said at least one add/subtract unit are controlled at least in part by immediate (imm) bits present in said at least one data field of said instruction.

17. The processor of claim 15, wherein said ALU comprises four multiplexers and four add/subtract units, each of said add/subtract units receiving said single operand as one input, and the output of the corresponding one of said four multiplexers as a second input.

18. The processor of claim 17, wherein each of said multiplexers comprises at least two inputs, said at least two inputs comprising values stored in said extension registers.

19. The processor of claim 17, wherein said ALU further comprises compare-select logic adapted to compare the output of at least two of said add/subtract units, and select at least one thereof as the output of said compare-select logic.

20. The processor of claim 19, further comprising at least one transition register, wherein the output of the compare portion of said compare-select logic is stored within said at least one transition register.

21. Data processor arithmetic logic unit apparatus, comprising:

at least one operand bus adapted to carry at least one operand thereon;

a plurality of constant busses each adapted to carry at least one value;

at least one control bus adapted to carry at least one control signal thereon;

a plurality of selection units, each of said units having a plurality of inputs and at least one output, at least one of said plurality of inputs comprising one of said constant busses, each of said selection units being adapted to multiplex between said plurality of inputs, the control of said multiplex function being related at least in part to said control signal present on said control bus;

a plurality of arithmetic units, each of said arithmetic units having as inputs (i) at least a portion of said at least one operand bus, and (ii) said at least one output of at least one of said selection units, the control of said arithmetic units being related at least in part to a signal present on said control bus;

at least one compare unit, said at least one compare unit having as an input the output of at least one of said arithmetic units, said at least one compare unit further having an output; and at least one result multiplexer, said at least one multiplexer having the same inputs as the respective one of said at least one compare unit, said at least one result multiplexer being controlled by said output of said respective one of said at least one compare unit.

22. The apparatus of claim 21, further comprising a plurality of registers adapted for holding respective ones of said values carried on said constant busses.

23. The apparatus of claim 21, further comprising at least one transition shift register adapted to receive at least a portion of the output of said at least one compare unit, said at least portion being related to the operation of said apparatus with respect to a trellis calculation.

24. The apparatus of claim 21, wherein said apparatus is utilized within a Single Instruction Multiple Data (SIMD) data processor, said apparatus and said SIMD processor being adapted to perform multiple butterfly calculations in parallel using a single software instruction to control its operation.

25. The apparatus of claim 21, wherein said apparatus is disposed within a data processor and adapted to complete execution of the instruction in a single clock cycle of said processor.

26. The apparatus of claim 21, further comprising a pipeline delay stage, said pipeline delay stage allowing use of an increased clock speed using multi cycle operation.

27. An arithmetic logic unit adapted for use with an extended data processor architecture, comprising:
a plurality of multiplexers;
a plurality of add/subtract units, each of said add/subtract units receiving a single operand as one input, and the output of a corresponding one of said plurality of multiplexers as a second input, corresponding ones of said multiplexers and said add/subtract units being controlled at least in part by immediate (imm) bits present in at least one data field of a single-operand instruction; and
compare-select logic adapted to compare the output of at least two of said add/subtract units, and select at least one thereof as the output of said compare-select logic.

28. The logic unit of claim 27, further comprising at least one transition register, wherein the output of the compare portion of said compare-select logic is stored within said at least one transition register.

29. Apparatus for performing at least one arithmetic operation in a data processor, comprising:
a plurality of multiplexers each having a plurality of inputs and at least one output;
a plurality of add/subtract units, each of said add/subtract units receiving a single operand from at least one single-operand instruction as one input thereto, and said at least one output of a corresponding one of said plurality of multiplexers as a second input;
wherein each of said plurality of add/subtract units are controlled at least in part by data present in said at least one single-operand instruction.

30. The apparatus of claim 29, wherein said data comprises short immediate (shimm) bits of said at least one instruction.

31. The apparatus of claim 29, further comprising a plurality of extension registers, and wherein at least two of said plurality of inputs to each of said plurality of multiplexers comprise values stored in said extension registers.

32. Apparatus for performing at least one arithmetic operation in a data processor, comprising:
a plurality of multiplexers each having a plurality of inputs and at least one output;
a plurality of arithmetic units, each of said arithmetic units receiving a single operand from at least one single-operand instruction as one input thereto, and said at least one output of a corresponding one of said plurality of multiplexers as a second input; and
compare-select logic adapted to compare the outputs of at least two of said plurality of arithmetic units, and select at least one of said outputs as the output of said compare-select logic;
wherein each of said plurality of arithmetic units are controlled at least in part by data present in said at least one single-operand instruction.

33. The apparatus of claim 32, wherein said plurality of arithmetic units comprise addition/subtraction units, and said at least one single-operand instruction comprises an add-compare-select (ACS) instruction.

34. The apparatus of claim 33, wherein said plurality of multiplexers comprises four multiplexers, said plurality of addition/subtraction units comprises four units, and said compare-select logic comprises at least two channels, each of said channels adapted to receive the output of two of said four addition subtraction units.

35. The apparatus of claim 33, wherein said ACS instruction comprises:
a first sliding window register with N-bit split writeback mode for the destination register; and
a second sliding window register with a standard incrementing 2×N-bit read mode.

36. A method of processing metrics, comprising:
storing a first portion of input metrics in a first portion of a storage device, said first portion of said storage device having a data width of A bits;
storing a second portion of said input metrics in a second portion of said storage device, said second portion of said storage device having a data width of B bits; and
using a single pointer to read said first and second portions of said input metrics from said first and second portions of said storage device;
wherein the acts of storing said first and second portions of said input metrics comprises using an N-bit addressing mode comprising half word width of said first or second portions of said storage device, and storing said first portion of said input metrics at an address b in said first portion of said storage device, and concurrently storing said second portion of said input metrics at address b in said second portion of said storage device.

37. The method of claim 36, wherein A=B=2×N-bits wide, and two input metric values of width N-bits are packed into each of 2×N-bit wide first and second portions of said storage device.

38. The method of claim 37, where N=16.

39. The method of claim 36, further comprising:
providing the first portion of said input metrics as an input to a single-operand instruction operation; and
incrementing said pointer at the end of the execution of said instruction to point to the next portion of said input metrics.

40. A method of processing metrics, comprising:
storing a first portion of input metrics in a first portion of a storage device, said first portion of said storage device having a data width of A bits;
storing a second portion of said input metrics in a second portion of said storage device, said second portion of said storage device having a data width of B bits;
using a single pointer to read said first and second portions of said input metrics from said first and second portions of said storage device;

reading metrics old(x) and old(x+1) from one of said portions of said storage device;

performing at least one arithmetic operation on metrics old(x) and old(x+1) to produce a result;

splitting said result into first and second result metric portions; and storing said first and second result metric portions in a new metric buffer;

arranging the first and second result metrics, using a single address pointer, so that said first result portion stored in a first portion of the new metric buffer and said second result portion stored in a second portion of the new metric buffer are in the same relative positions as old(x) and old($x^{k-2}$+1) were in said storage device.

* * * * *